United States Patent
Kohama et al.

(10) Patent No.: US 8,217,704 B2
(45) Date of Patent: Jul. 10, 2012

(54) GATE DRIVE DEVICE

(75) Inventors: Takanori Kohama, Matsumoto (JP); Kazutaka Masuzawa, Ueda (JP); Naoki Kumagai, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 150 days.

(21) Appl. No.: 12/662,918

(22) Filed: May 11, 2010

(65) Prior Publication Data

US 2010/0289562 A1    Nov. 18, 2010

(30) Foreign Application Priority Data

May 13, 2009   (JP) ................... 2009-116445

(51) Int. Cl.
*H03K 17/14*   (2006.01)
(52) U.S. Cl. ........................ 327/378; 327/108
(58) Field of Classification Search .................. None
See application file for complete search history.

(56) References Cited

U.S. PATENT DOCUMENTS

| | | | | |
|---|---|---|---|---|
| 4,857,770 A * | 8/1989 | Partovi et al. | ............ | 326/83 |
| 4,894,561 A * | 1/1990 | Nogami | ............ | 326/27 |
| 5,017,807 A * | 5/1991 | Kriz et al. | ............ | 326/27 |
| 5,164,621 A * | 11/1992 | Miyamoto | ............ | 327/262 |
| 5,214,320 A * | 5/1993 | Truong | ............ | 326/33 |
| 5,291,071 A * | 3/1994 | Allen et al. | ............ | 327/108 |
| 5,376,843 A * | 12/1994 | Tien et al. | ............ | 326/68 |
| 5,396,117 A * | 3/1995 | Housen et al. | ............ | 327/480 |
| 5,408,191 A * | 4/1995 | Han et al. | ............ | 326/33 |
| 5,428,303 A * | 6/1995 | Pasqualini | ............ | 326/27 |
| 5,510,729 A * | 4/1996 | Reymond | ............ | 326/33 |
| 5,557,223 A * | 9/1996 | Kuo | ............ | 327/108 |
| 5,627,460 A * | 5/1997 | Bazinet et al. | ............ | 323/288 |
| 5,731,713 A * | 3/1998 | Proebsting et al. | ............ | 326/71 |
| 5,805,012 A * | 9/1998 | Jeon et al. | ............ | 327/378 |
| 5,914,617 A * | 6/1999 | Bartlett | ............ | 326/81 |
| 5,990,711 A * | 11/1999 | Sekimoto | ............ | 327/112 |
| 6,087,817 A * | 7/2000 | Varga | ............ | 323/282 |
| 6,127,841 A * | 10/2000 | Roohparvar | ............ | 326/34 |
| 6,459,325 B1 * | 10/2002 | Hall et al. | ............ | 327/391 |
| 6,529,074 B1 * | 3/2003 | Melanson et al. | ............ | 330/251 |
| 6,724,217 B2 * | 4/2004 | Labram et al. | ............ | 326/26 |
| 7,075,343 B2 * | 7/2006 | Jiang | ............ | 327/108 |
| 7,242,222 B2 * | 7/2007 | Omata | ............ | 326/83 |
| 7,330,053 B2 * | 2/2008 | Brucke et al. | ............ | 326/83 |

(Continued)

FOREIGN PATENT DOCUMENTS

JP    02-007714 A    1/1990

(Continued)

*Primary Examiner* — Thomas J Hiltunen
(74) *Attorney, Agent, or Firm* — Rabin & Berdo, P.C.

(57) ABSTRACT

A gate drive device which can suppress the fluctuation of an internal power source voltage and output voltage, while reducing the number of parts by omitting a bypass capacitor connected in parallel with a semiconductor integrated circuit, is provided. The gate drive device drives the gate of an active element with a large input capacity, such as an IGBT or MOSFET, and includes a semiconductor integrated circuit. The semiconductor integrated circuit has an internal power source based on an external power source, such as a battery. The semiconductor integrated circuit incorporates a voltage drop suppressing circuit, configured so that, if an input external power source voltage momentarily drops below a minimum operating voltage, a drop of an internal power source voltage below the minimum operating voltage, and a sharp drop in a voltage output to the gate, are prevented by the voltage drop suppressing circuit.

15 Claims, 9 Drawing Sheets

U.S. PATENT DOCUMENTS

| | | | |
|---|---|---|---|
| 7,635,998 B1 * | 12/2009 | Taki | 327/108 |
| 7,737,761 B2 * | 6/2010 | Ishikawa et al. | 327/380 |
| 2005/0237105 A1 * | 10/2005 | Park | 327/539 |
| 2006/0038547 A1 * | 2/2006 | Ahmad | 323/284 |
| 2007/0146020 A1 * | 6/2007 | Williams | 327/110 |
| 2008/0122497 A1 * | 5/2008 | Ishikawa et al. | 327/108 |
| 2009/0237126 A1 * | 9/2009 | Chen | 327/109 |
| 2009/0295228 A1 * | 12/2009 | Ochi | 307/66 |
| 2010/0164457 A1 * | 7/2010 | Al-Shyoukh | 323/284 |
| 2010/0213989 A1 * | 8/2010 | Nakatake et al. | 327/109 |
| 2010/0308873 A1 * | 12/2010 | Kure et al. | 327/109 |

FOREIGN PATENT DOCUMENTS

| | | |
|---|---|---|
| JP | 04-115715 A | 4/1992 |
| JP | 06-318678 A | 11/1994 |
| JP | 2000-059195 A | 2/2000 |

* cited by examiner

GATE DRIVE DEVICE

CROSS-REFERENCE TO RELATED APPLICATIONS

This application claims priority under 35 U.S.C. §119 from JP PA 2009-116445, filed May 13, 2009, the entirety of which is incorporated herein by reference.

BACKGROUND OF THE INVENTION

1. Technical Field

The present invention relates to a gate drive device which drives the gate of an active element with a large input capacity, such as an insulated gate bipolar transistor (IGBT) or power metal oxide semiconductor field effect transistor (MOSFET).

2. Related Art

As this kind of gate drive device, there is known a gate drive circuit which drives the gate of an IGBT (for example, refer to JP-A-2000-59195).

This gate drive circuit has a configuration wherein a P-type MOSFET, a supersaturation reactor, a diode, and an N-type MOSFET are connected in series between a voltage source and a ground. Then, a connection point between the P-type MOSFET and supersaturation reactor is connected via a gate protection resistor to the gate of the IGBT. Also, a capacitor charged by the voltage source is connected in parallel with the series circuit of the P-type MOSFET, supersaturation reactor, diode, and N-type MOSFET. A power source voltage applied to the series circuit of the P-type MOSFET, supersaturation reactor, diode, and N-type MOSFET is stabilized by the capacitor.

Also, in the event that a high, abnormal current higher than the normal current flows through an active element such as an IGBT or MOSFET, the voltage between the gate and emitter of the active element rises, due to which a collector current increases, and the reliability of the active element decreases. In order to prevent the decrease in reliability, there is known a device which protects the element when there is an abnormal current by clamping a gate voltage applied to the gate of the active element at or below an absolute maximum rated value (for example, refer to JP-A-2-7714).

Generally, as a gate drive device in a case of making the load an inductor L, and applying an active element such as an IGBT which has a current sensing function, a control IC 4 configured of a semiconductor integrated circuit is applied, as shown in FIG. 6.

In this case, an inductor L, acting as the load, and an IGBT 3 are connected in series between a power source line 1, to which a power source voltage Vbatt of a battery acting as an external power source is applied, and a ground line 2 connected to a ground gnd.

A series circuit of a current limiting resistor RB and the control IC 4 acting as a gate drive device is connected in parallel with the inductor L and IGBT 3. A current sensing voltage Vsns (see FIG. 7) output from a current sensing terminal S of the IGBT 3 is input into the control IC 4. Also, a gate signal output from the control IC 4 is supplied to the gate of the IGBT 3.

Furthermore, a noise removing capacitor C1, which removes high frequency noise from the inductor L, is connected in parallel with the current limiting resistor RB and control IC 4. Also, a bypass capacitor C2, corresponding to the capacitor in JP-A-2000-59195, is connected in parallel with the control IC 4 on its power source line 1 side and ground line 2 side. L1 and L2 are line inductors of the power source line 1 and ground line 2 respectively.

A specific configuration of the control IC 4 is such that, as shown in FIG. 7, a series circuit of a constant current source 13, a P-type MOSFET 14, and an N-type MOSFET 15 is connected between an internal power source line 11, to which an internal power source voltage Vdc is applied, and a ground line 12 connected to the ground gnd. A current controlling P-type MOSFET 16 is connected in parallel with the N-type MOSFET 15. Herein, switch signals SWp and SWn (not labeled) synchronized with a control input Sin input into an input terminal tin (see FIG. 6) of the control IC 4 are supplied to the gates of the P-type MOSFET 14 and N-type MOSFET 15. Also, an output signal of an operational amplifier 17, into whose non-inverting input side a reference voltage Vref is input and into whose inverting input side the current sensing voltage Vsns is input, is input into the P-type MOSFET 16. A gate voltage Vg (not labeled) is controlled by the operational amplifier 17 in such a way that the current sensing voltage Vsns, wherein a sensing current input from the current sensing terminal S of the IGBT is converted into a voltage by a sensing resistor, becomes equivalent to the reference voltage Vref.

In FIG. 6, the bypass capacitor C2 is connected in parallel between point C of the power source line side and point B of the ground line 12 side of the control IC 4. For this reason, even in the event that the battery voltage Vbatt fluctuates, as shown in (a) of FIG. 8, it is possible to prevent a steep change occurring in a current Ic flowing through the IGBT 3, as shown in (g) of FIG. 8.

That is, on the battery voltage Vbatt fluctuating like a battery ripple, a voltage Vab between connection points A and B of the power source line 1 and ground line 2 of the series circuit of the current limiting resistor RB and control IC 4 fluctuates, as shown in (b) of FIG. 8. That is, a momentary voltage drop occurs at a falling point of the battery voltage Vbatt due to a resonance circuit configured of the line inductors L1 and L2, and the capacitor C1. Then, the momentary voltage drop gradually becomes larger along with an increase in the collector current Ic, and momentarily falls below a minimal operating power source voltage of the control IC 4.

However, as the bypass capacitor C2 is connected in parallel with the control IC 4, a low pass filter (LPF) is configured by the bypass capacitor C2 and the current limiting resistor RB. Due to the effect of the low pass filter, a voltage Vcb between a connection point C of the bypass capacitor C2 and the connection point B alternates between a gentle decrease and increase, as shown in (c) of FIG. 8. For this reason, the internal power source voltage Vdc of the control IC is maintained at an approximately constant voltage sufficiently higher than the minimal operating power source voltage of the control IC 4, as shown in (e) of FIG. 8.

A control input signal Sin input into an input terminal tin of the control IC 4 inverts from a logical value "0" to a logical value "1" at a point t1, and inverts from the logical value "1" to the logical value "0" at a point t3, as shown in (d) of FIG. 8. In this case, the gate voltage Vg output from the control IC 4 reaches a comparatively high level in response to a rise of the control input signal Sin, after which it gradually decreases, becoming a constant voltage from a point t2, as shown in (f) of FIG. 8.

For this reason, as shown in (g) of FIG. 8, the current Ic flowing through the IGBT 3 starts increasing from zero at the point t1, gradually increasing until the vicinity of the point t2, after which a peak value alternates between a gentle decrease and increase, and it returns to zero at the point t3.

Consequently, it is possible to prevent a steep fluctuation occurring in the current flowing through the IGBT 3 due to the effect of the voltage fluctuation of the battery power source voltage Vbatt.

However, when omitting the bypass capacitor C2 with the object of reducing the number of parts, it becomes impossible to utilize the effect of the low pass filter. For this reason, the voltage Vcb between the connection points C and B of the control IC 4 takes on the same waveform as the voltage Vab between the connection points A and B, as shown in (c) of FIG. 9. Consequently, a momentary, large voltage drop occurs in the internal power source voltage Vdc, as shown in (e) of FIG. 9, and a momentary, large voltage drop also occurs in the gate voltage Vg, as shown in (f) of FIG. 9. In response to this, a steep change is caused in the current Ic flowing through the IGBT 3, as shown in (g) of FIG. 9, and an induced voltage proportional to the current change is generated at the inductor L acting as the load.

One of the reasons causing the momentary, large voltage drop in the gate voltage Vg is that the relationship between the internal power source voltage Vdc of the control IC 4 and the gate voltage Vg temporarily becomes such that Vdc is less than Vg, and a gate charge accumulated at the gate of the IGBT 3 flows out to the internal power source voltage Vdc side through a body diode D1 as a parasitic diode of the P-type MOSFET 14.

Another reason is that, in the event of a steep voltage drop during a current limiting control, a gate charge accumulated at the gate of the IGBT 3 flows out to the ground line 12 through the P-type MOSFET 16.

In the face of this kind of steep voltage drop, it is not possible either to obtain a sufficient advantage from the method described in JP-A-2-7714, whereby the voltage between the gate and emitter of the IGBT is clamped.

SUMMARY OF THE INVENTION

In view of the foregoing, the invention, being conceived bearing in mind the unsolved problems of the above-described known example, has an object of providing a gate drive device which can suppress the fluctuation of an internal power source voltage and output voltage, while reducing the number of parts by omitting a bypass capacitor connected in parallel with a semiconductor integrated circuit.

In order to achieve the above-described object, a gate drive device according to one aspect of the invention, which drives the gate of an active element with a large input capacity such as an IGBT or MOSFET, includes a semiconductor integrated circuit, which has an internal power source circuit forming an internal power source based on an external power source supplied from an external power source such as a battery. The semiconductor integrated circuit incorporates a voltage drop suppressing circuit. The voltage drop suppressing circuit, when an input power source voltage of the external power source momentarily drops below a minimum operating voltage, prevents a drop of an internal power source voltage of the internal power source circuit below the minimum operating voltage, and a steep drop in a voltage output to the gate.

Also, in the gate drive device according to the aspect of the invention, the voltage drop suppressing circuit has a configuration such that it at least maintains the internal power source voltage at or above the minimum operating voltage for a time longer than a voltage drop time for which the input power source voltage drops below the minimum operating voltage. According to this configuration, the fluctuation of the internal power source voltage is suppressed.

Also, in the gate drive device according to the aspect of the invention, the voltage drop suppressing circuit at least supplies a minimum current at which the circuit connected to the internal power source circuit operates during the voltage drop time for which the input external power source voltage drops below the minimum operating voltage.

Also, in the gate drive device according to the aspect of the invention, the voltage drop suppressing circuit is configured to have an undervoltage detection circuit and a switching element. The undervoltage detection circuit detects a voltage drop in one of the external power source voltage and internal power source voltage input into the semiconductor integrated circuit. Also, the switching element is configured of, e.g., comprises, for example, an N-type MOSFET and, when a drop in a power source voltage is detected by the undervoltage detection circuit, suppresses at least one of a drop in the output voltage and a drop in the internal power source voltage of the internal power source circuit.

Also, the gate drive device according to the aspect of the invention is configured so that the switching element is configured of, e.g., comprises, an N-type MOSFET. A control voltage which has a fall time sufficiently short in comparison with the drop time for which the external power source voltage and internal power source voltage drop below the minimum operating voltage, and a rise time sufficiently long in comparison with the drop time, is applied to the gate of the N-type MOSFET. According to this configuration, when the power source voltage drops below the minimum operating voltage, the N-type MOSFET is put into a turned off condition in a short time, and a flowing out of a charge accumulated at the gate of the active element is prevented.

Also, the gate drive device according to the aspect of the invention is such that the undervoltage detection circuit is configured of, e.g., comprises, a self-biasing circuit. According to this configuration, it is possible to detect a drop in the internal power source voltage with a simple configuration.

Also, the gate drive device according to the aspect of the invention is such that the semiconductor integrated circuit has a configuration wherein a first P-type MOSFET configuring, e.g., forming, a pull-up switch, and a third P-type MOSFET configuring, e.g., forming, a source follower connected in parallel with a first N-type MOSFET configuring, e.g., forming, a pull-down switch, are connected in series, and a connection point of the first P-type MOSFET and first N-type MOSFET is connected to the gate of the active element. Furthermore, the semiconductor integrated circuit includes at least a second P-type MOSFET as a constant current source inserted, e.g., connected, between the first P-type MOSFET and an internal power source circuit, and a second N-type MOSFET connected between the third P-type MOSFET and a ground which operates in accordance with a control voltage from the undervoltage detection circuit.

Put in other terms, embodiments of the invention relate to a gate drive device that can comprise a semiconductor integrated circuit, connected to an internal power source circuit supplied by an external power source. The gate drive device can further comprise a voltage drop suppressing circuit configured to, if an external power source voltage corresponding to the external power source drops below a minimum operating voltage, prevent a drop of an internal power source voltage corresponding to the internal power source circuit below the minimum operating voltage. The voltage drop suppressing circuit can further be configured to prevent a drop of at least a predetermined magnitude in a voltage output to a gate of the gate drive device.

In the gate drive device, the voltage drop suppressing circuit can further be configured to maintain the internal power source voltage at or above the minimum operating voltage for a time longer than a voltage drop time during which the external power source voltage drops below the minimum operating voltage. Moreover, the voltage drop suppressing circuit can further include an undervoltage detection circuit configured to detect a voltage drop in at least one of the internal power source voltage or the external power source voltage, and a switching element configured to, if a drop in the at least one of the internal power source voltage or the external power source voltage is detected by the undervoltage detection circuit, suppress at least one of the drop in the voltage output to the gate or a drop in the internal power source voltage.

In the gate drive device, the switching element can include an N-type MOSFET. A control voltage configured to be applied to a gate of the N-type MOSFET can have a fall time sufficiently short, in comparison with a drop time during which at least the external power source voltage drops below the minimum operating voltage, to allow the switching element to assume a condition to suppress the drop in the voltage output to the gate, and a rise time sufficiently long in comparison with the drop time to allow the switching element to assume the condition to suppress the drop in the voltage output to the gate. In the gate drive device, the undervoltage detection circuit can comprise a self-biasing circuit.

Moreover, in the gate drive device, the semiconductor integrated circuit can further include a first P-type MOSFET and a third P-type MOSFET connected in series, and a first N-type MOSFET connected in parallel with the third P-type MOSFET. The first P-type MOSFET can form a pull-up switch, the third P-type MOSFET can form a source follower, and a connection point of the first P-type MOSFET and first N-type MOSFET can be connected to the gate. The semiconductor integrated circuit can further include a second P-type MOSFET forming a constant current source, connected between the first P-type MOSFET and an internal power source circuit, and a second N-type MOSFET connected between the third P-type MOSFET and a ground, the second N-type MOSFET configured to in accordance with a control voltage of the undervoltage detection circuit.

According to this configuration, when a voltage drop in the power source voltage input into the semiconductor integrated circuit, or in the internal power source voltage, is detected in the undervoltage detection circuit, it is possible to suppress a sudden change in the output voltage by controlling the second N-type MOSFET into a turned off condition, and to prevent the flowing out of the capacity accumulated at the gate of the active element.

According to the invention, when the gate of an active element with a large capacity such as an IGBT or power MOSFET is driven by a gate drive device, a voltage drop suppressing circuit is incorporated in a semiconductor integrated circuit and, when an input power source voltage momentarily drops below a minimum operating voltage, a drop of an internal power source voltage of the internal power source circuit below the minimum operating voltage, and a sharp drop in a voltage output to the gate, are prevented by the voltage drop suppressing circuit. Additionally, the voltage drop suppressing circuit supplies a minimum current at which the circuit connected to the internal power source can operate during the voltage drop period. For this reason, an advantage is obtained wherein it is possible to prevent at least one of the internal power source voltage and output voltage of the semiconductor integrated circuit from momentarily dropping below the minimum operating voltage of the semiconductor integrated circuit, while reducing the number of parts by omitting a bypass capacitor inserted in parallel with the semiconductor integrated circuit.

DETAILED DESCRIPTION OF THE INVENTION

Hereafter, a description will be given, based on the drawings, of embodiments of the invention.

Figure 1:
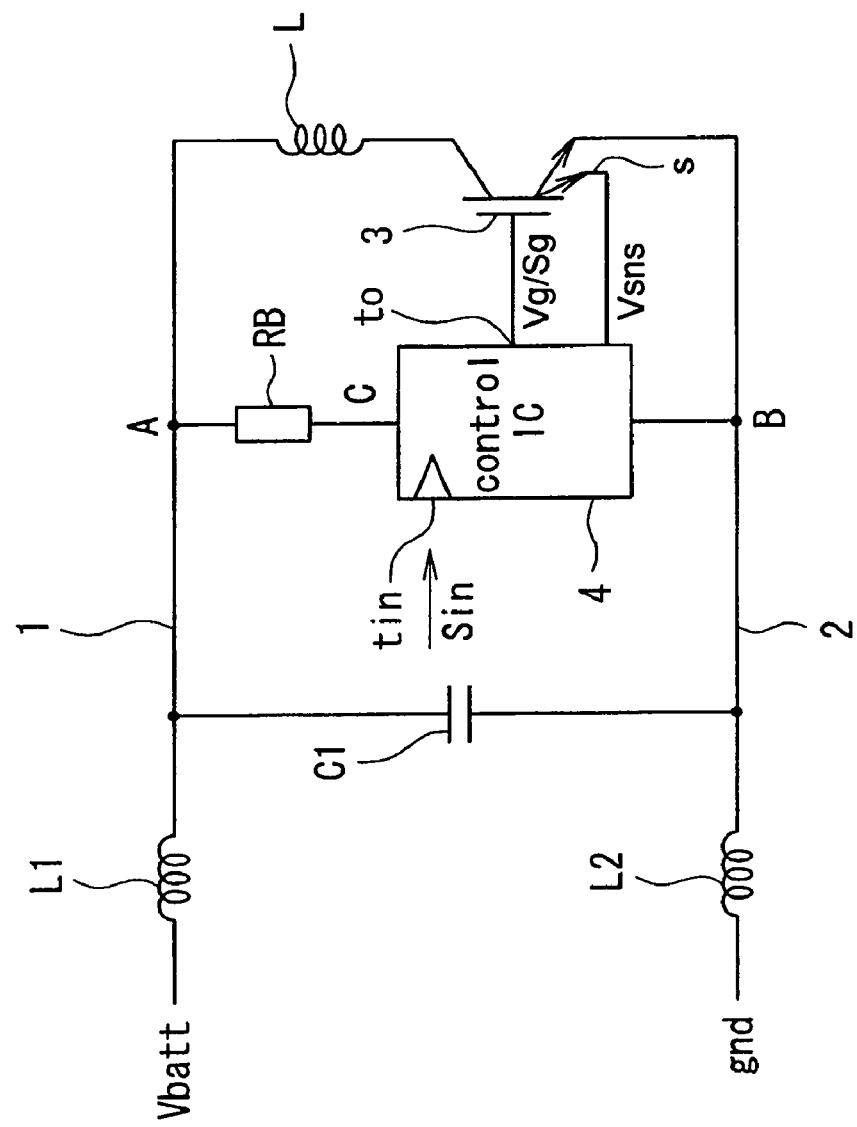
FIG. 1 is a circuit diagram showing a first embodiment of the invention.
Figure 6:
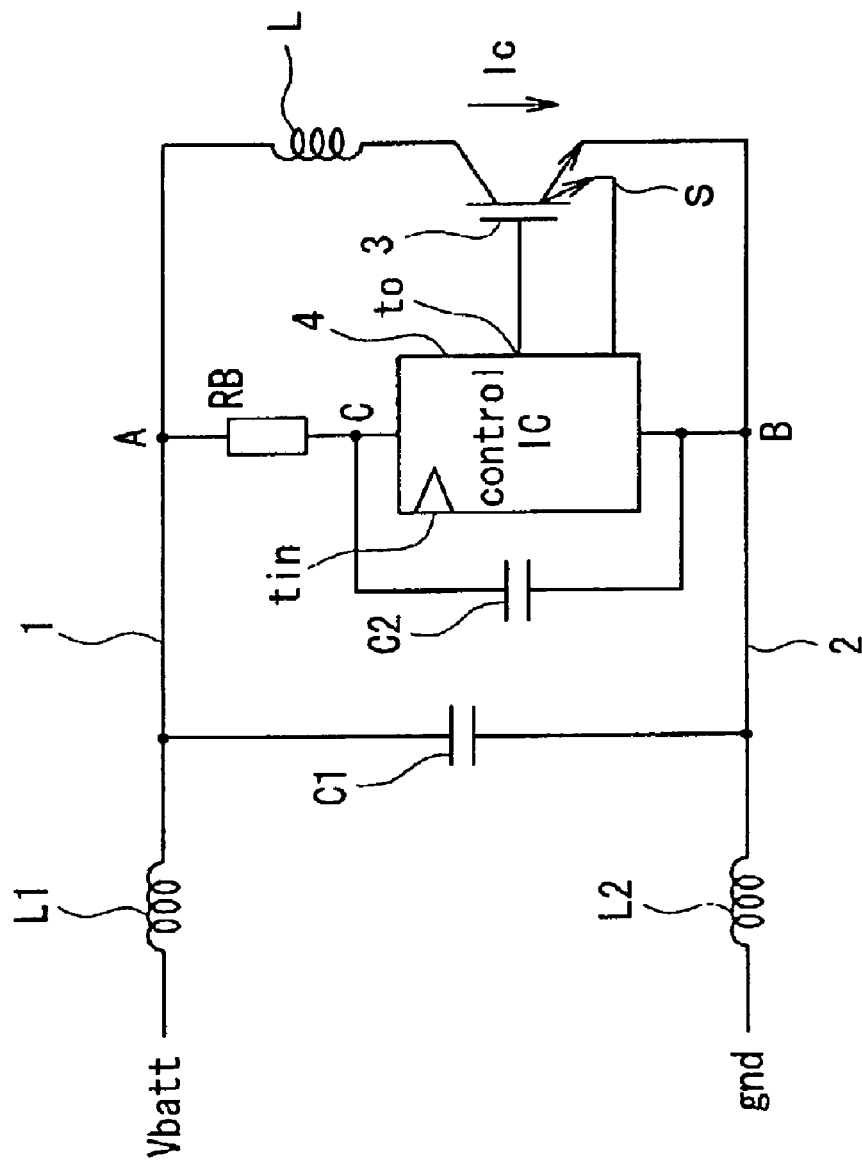
FIG. 6 is a circuit diagram showing a known example.
Figure 7:
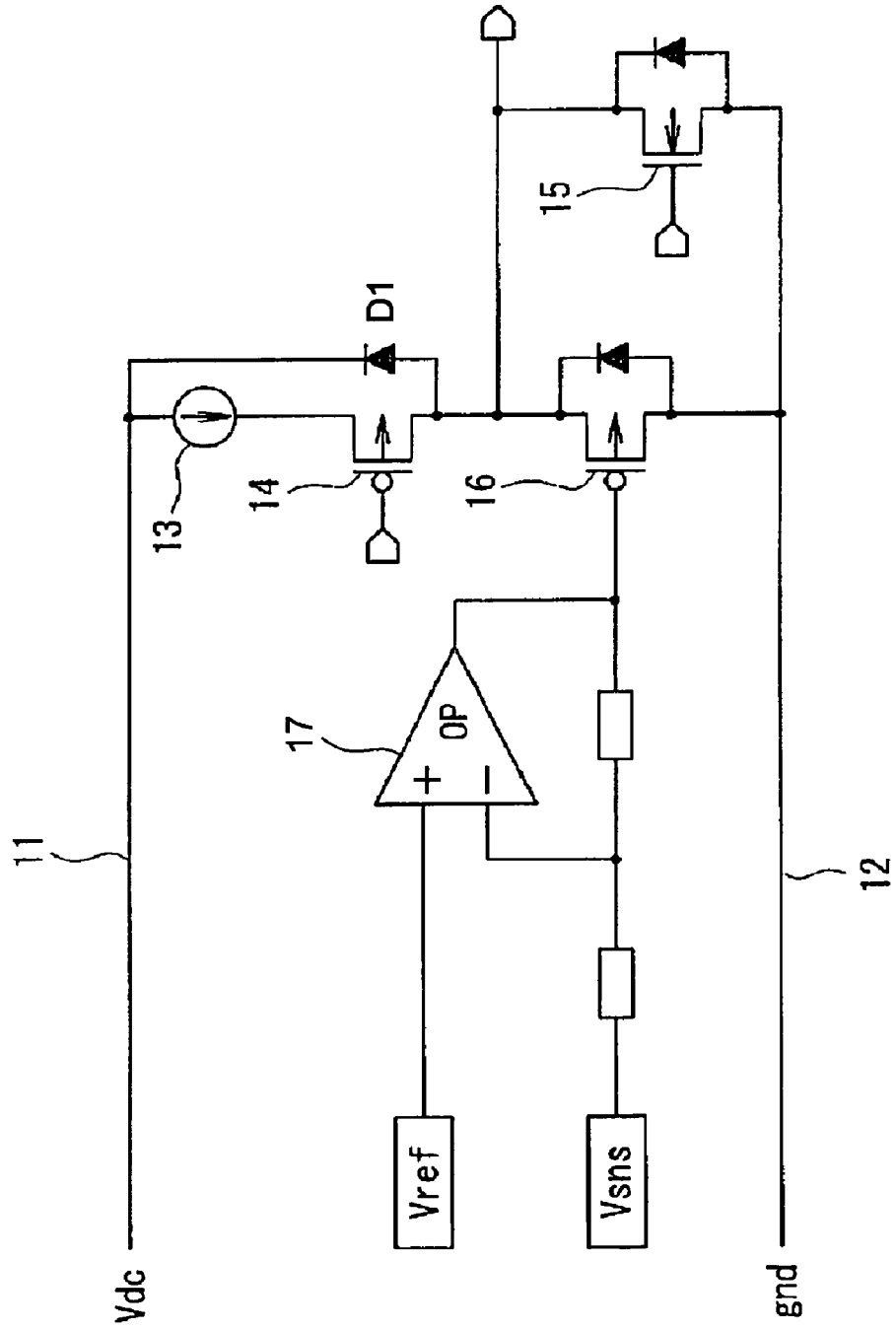
FIG. 7 is a circuit diagram showing a specific configuration of a semiconductor integrated circuit of the known example.
Figure 8:
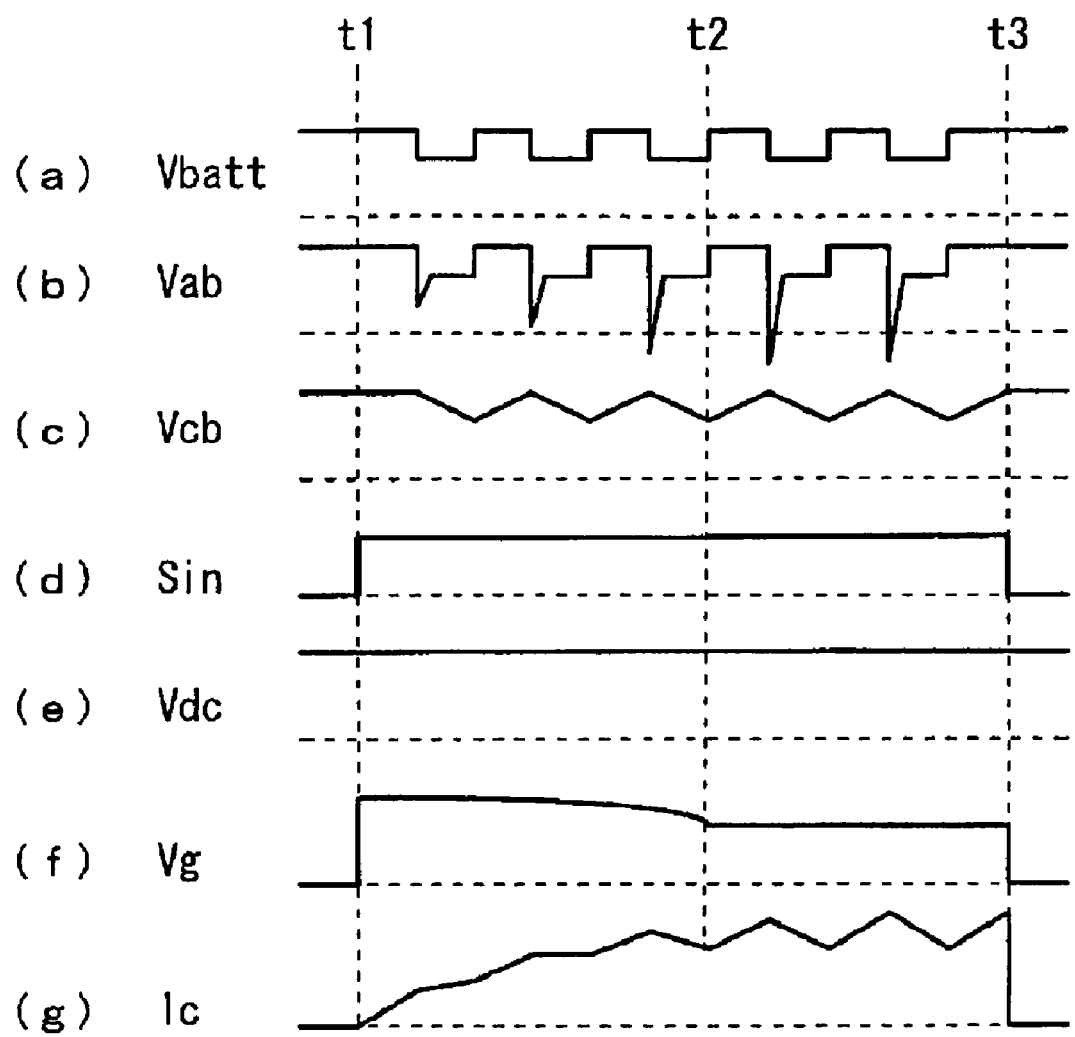
FIG. 8 is a signal waveform diagram accompanying a description of an operation of the known example in a case of providing a bypass capacitor.

FIG. 1 is a circuit diagram showing a first embodiment of the invention. The circuit shown in FIG. 1 has the same configuration as the configuration of the circuit of FIG. 6, which shows the previously described known example, except that the bypass capacitor C2 is omitted.

As shown in FIG. 1, an inductor L acting as a load, and an IGBT 3 acting as a large capacity active element, are connected in series between a power source line 1, to which a battery voltage Vbatt is applied from a battery acting as a power source, and a ground line 2 connected to a ground gnd.

The gate of the IGBT 3 is driven by a control IC 4 configured of, e.g., comprising, a semiconductor integrated circuit. The power source input side of the control IC 4 is connected at a connection point A to the power source line 1 via a current limiting resistor RB, and the ground side is connected to the ground line 2 at a connection point B.

Also, the control IC 4 is configured so that, as well as a control signal Sin being input into an input terminal tin, a current sensing voltage Vsns output from a current sensing terminal S of the IGBT 3 is input. Furthermore, a gate voltage Vg supplied to the gate of the IGBT 3 is output from an output terminal to of the control IC 4.

Also, a noise removing capacitor C1, which removes high frequency noise from the inductor L, is connected in parallel with the current limiting resistor RB and control IC 4. L1 and L2 are line inductors of the power source line 1 and ground line 2 respectively.

Figure 2:
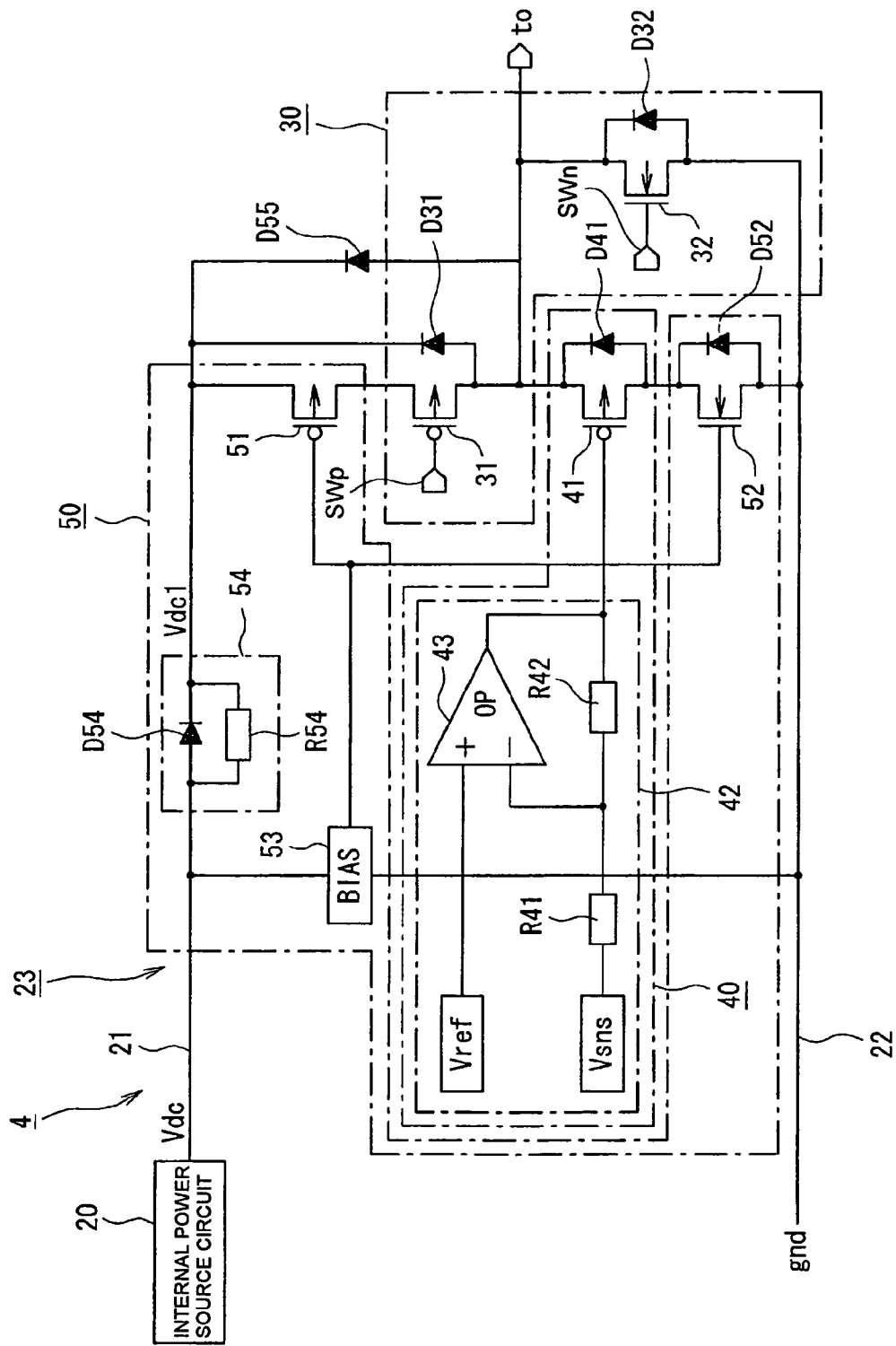
FIG. 2 is a circuit diagram showing a specific configuration of a semiconductor integrated circuit of FIG. 1.

A specific configuration of the control IC 4 is such that, as shown in FIG. 2, a gate control module 23 is connected between an internal power source line 21, connected to an internal power source circuit 20 which forms an internal power source voltage Vdc based on a power source voltage input via the current limiting resistor RB, and a ground line 22 connected to the ground gnd.

The gate control module 23 includes a switch circuit 30, a current limiting circuit 40, and a voltage drop suppressing circuit 50.

The switch circuit 30 is of an emitter follower configuration wherein a first P-type MOSFET 31 configuring, e.g., forming, a pull-up switch, and a first N-type MOSFET 32 configuring, e.g., forming, a pull-down switch, are connected in series. A diode D32 may be connected in parallel with the MOSFET 32. The output terminal to is led out from, e.g., connected to, a connection point of the P-type MOSFET 31 and N-type MOSFET 32, and the output terminal to is connected to the gate of the IGBT 3 (see FIG. 1).

The current limiting circuit 40 includes a third P-type MOSFET 41, as a switching element connected to a connection point of the P-type MOSFET 31 and N-type MOSFET 32 of the switch circuit 30, and a gate control circuit 42, which drives the gate of the P-type MOSFET 41. A diode D41 may be connected in parallel with the MOSFET 41. The gate control circuit 42 has an operational amplifier 43 into whose inverting input side the current sensing voltage Vsns input from the current sensing terminal S of the IGBT 3 is input via a resistor R41. A reference voltage Vref is input into the non-inverting input side of the operational amplifier 43, and the output side of the operational amplifier 43 is connected to the gate of the third P-type MOSFET 41. Also, a feedback resistor R42 is inserted, e.g., connected, between the inverting input side and output side of the operational amplifier 43.

The voltage drop suppressing circuit 50 has a second P-type MOSFET 51, configuring, e.g., forming, a constant current source, inserted, e.g., connected, between the P-type MOSFET 31 of the switch circuit 30 and an internal power source line voltage Vdc1 on the downstream side of a parallel circuit 54, and a second N-type MOSFET 52 inserted, e.g., connected, between the P-type MOSFET 41 of the current limiting circuit 40 and the ground line 22. A diode D52 may be connected in parallel with the MOSFET 52. The gates of the P-type MOSFET 51 and N-type MOSFET 52 are driven by a self-biasing circuit 53. The self-biasing circuit 53 is connected between the internal power source line 21, on the upstream side of the parallel circuit 54, and the ground line 22. Because it is necessary for the bias level to drive the P-type MOSFET 51, it is set to be equal to or higher than a threshold voltage of the P-type MOSFET 51, and lower than the internal power source voltage Vdc. The bias level is also connected to the gate of the N-type MOSFET 52. For this reason, when a steep voltage drop momentarily occurs in the internal power source voltage Vdc, the bias level voltage drops earlier by the amount of the P-type MOSFET 51 threshold voltage, and it is possible to turn off the N-type MOSFET 52 instantaneously. It is necessary to reduce the on-resistance of the N-type MOSFET 52 so that it can draw the gate potential of the IGBT 3 sufficiently to the ground line 22 when limiting the current. Also, the parallel circuit 54, which is configured of, e.g., comprises, a forward biased diode D54 inserted in the internal power source line 21, and a resistor R54, is inserted in the voltage drop suppressing circuit 50.

Next, a description will be given of an operation of the first embodiment.

Figure 3:
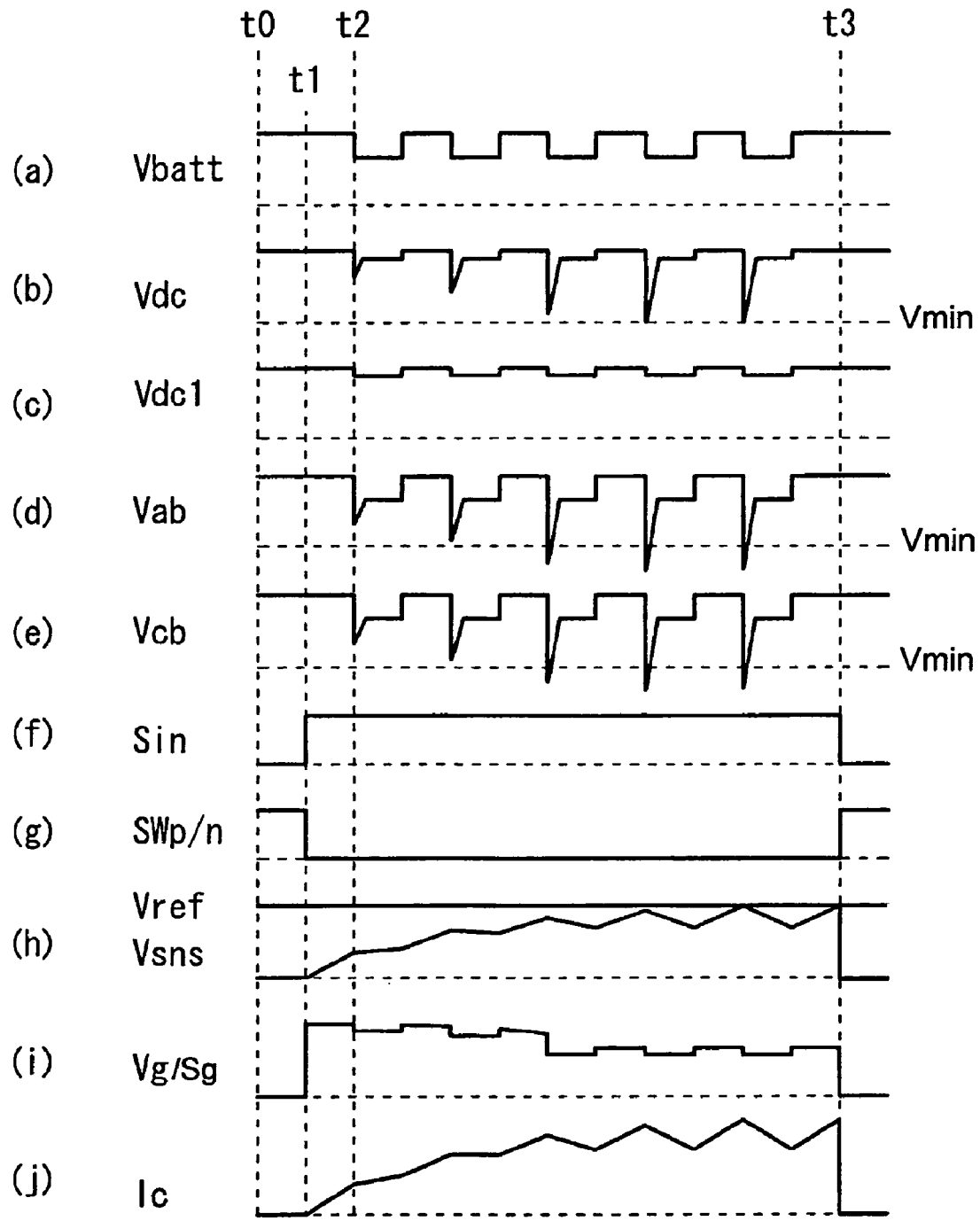
FIG. 3 is a signal waveform diagram accompanying a description of an operation of the first embodiment.

FIG. 3 is a signal waveform diagram for illustrating an operation of the first embodiment.

Assuming that at a point t0, the battery voltage Vbatt is normal at a predetermined constant voltage, as shown in (a) of FIG. 3, in this condition, the internal power source voltage Vdc, formed by the internal power source circuit 20 and applied to the internal power source line 21, is formed as shown in (b) of FIG. 3. In the same way, an internal power line voltage Vdc1 of the parallel circuit 54 inserted in the internal power source line 21 is also approximately equivalent to the internal power source voltage Vdc, as shown in (c) of FIG. 3.

An inter-terminal voltage Vab between the connection points A and B of the power source line 1 and ground line 2, to which the control IC 4 is connected, is approximately equivalent to the battery voltage Vbatt, as shown in (d) of FIG. 3. In the same way, an inter-terminal voltage Vcb between a connection point C of the current limiting resistor RB and control IC 4 and the connection point B of the ground line 2 is also approximately equivalent to the battery voltage Vbatt, as shown in (e) of FIG. 3.

Assuming that the control signal Sin input into the input terminal tin of the control IC 4 is of a logical value "Low", as shown in (f) of FIG. 3, gate signals SWp and SWn input into the gates of the P-type MOSFET 31 and N-type MOSFET 32 of the switch circuit 30 are of a logical value "High", as shown in (g) of FIG. 3, the P-type MOSFET 31 is in a turned off condition, and the N-type MOSFET 32 is in a turned on condition.

For this reason, as the gate voltage Vg of the IGBT 3 is at the ground level, as shown in (i) of FIG. 3, the IGBT 3 is in a turned off condition, and a current Ic flowing through the IGBT 3 is maintained at "0", as shown in (j) of FIG. 3.

For this reason, the current sensing voltage Vsns output from the current sensing terminal S of the IGBT 3 is also maintained at "0", as shown in (h) of FIG. 3.

In a condition in which the turned off condition of the IGBT 3 continues, on the control signal Sin input into the input terminal tin of the control IC 4 attaining the logical value "High" at a point t1, as shown in (f) of FIG. 3, the signals SWp and SWn supplied to the P-type MOSFET 31 and N-type MOSFET 32 of the switch circuit 30 invert from the logical value "High" to the logical value "Low" in response, as shown in (g) of FIG. 3. In response to this, the P-type MOSFET 31 of the switch circuit 30 changes to the turned on condition, the N-type MOSFET 32 changes to the turned off condition, and the gate voltage Vg is of a positive voltage approximately coinciding with the internal power source voltage Vdc, as shown in (i) of FIG. 3. For this reason, the IGBT 3 changes to the turned on condition, and the current Ic flowing through the IGBT 3 gradually increases, as shown in (j) of FIG. 3. In response to this, the current sensing voltage Vsns, generated by a sensing current output from the current sensing terminal S of the IGBT 3 flowing through a sensing resistor inside the control IC 4, gradually increases, as shown in (h) of FIG. 3. Subsequently, a current limiting process is carried out so that the current sensing voltage Vsns approximately coincides with the reference voltage Vref.

However, on a voltage fluctuation, wherein voltage drops are repeated in a predetermined cycle, occurring in the battery voltage Vbatt at a point t2 subsequent to the point t1, as shown in (a) of FIG. 3, a momentary overshoot occurs at a falling point of the internal power source voltage Vdc output from the internal power source circuit 20 of the control IC 4. The momentary overshoot occurs in response to the voltage fluctuation of the battery voltage Vbatt, as shown in (b) of FIG. 3. The overshoot becomes larger along with an increase in the collector current Ic, and eventually falls below a minimal operating voltage Vmin of the control IC 4.

Vab is dropped by a resonance with line inductors L1 and L2, and a noise removing capacitor C1. Therefore, Vdc is dropped, and Vab and Vdc momentarily reach a condition in which they drop to or below the minimal operating voltage Vmin of the semiconductor integrated circuit, as shown in FIG. 3.

However, on the internal power source voltage Vdc taking on a fluctuating condition, the voltage fluctuation is detected by the self-biasing circuit 53 of the voltage drop suppressing circuit 50, and its bias level drops steeply. In response to this, the P-type MOSFET 51 continues to be in the turned on condition, but the N-type MOSFET 52 changes to the turned off condition.

For this reason, when carrying out a current limiting process in the current limiting circuit 40 in order to cause the current sensing voltage Vsns to coincide with the reference voltage Vref, even in the event that the P-type MOSFET 41 is controlled into the turned on condition, the N-type MOSFET 52 continues to be in the turned off condition. As a result, it is possible to reliably prevent capacity accumulated at the gate of the IGBT 3 being discharged through the P-type MOSFET 41 to the ground line 22. For this reason, the IGBT 3 can continue to be in the turned on condition.

Meanwhile, on the internal power source voltage Vdc, by momentarily dropping steeply, reaching a condition in which it is lower than the gate voltage Vg of the IGBT 3, a charge accumulated at the gate of the IGBT 3 flows out to the internal power source line 21 through a body diode D31 as a parasitic diode of the P-type MOSFET 31 of the switch circuit 30. However, the parallel circuit 54 being inserted in the internal power source line 21, a flowing out to the internal power source circuit 20 is prevented by the diode D54 of the parallel circuit 54. Also, as a low pass filter is configured of, e.g., formed by, the gate capacitor of the IGBT 3 and the resistor R54, as well as it being possible to prevent a momentary movement of the gate charge to the internal power source circuit 20, the minimum current at which the circuit connected to the internal power source can operate is supplied.

Figure 9:
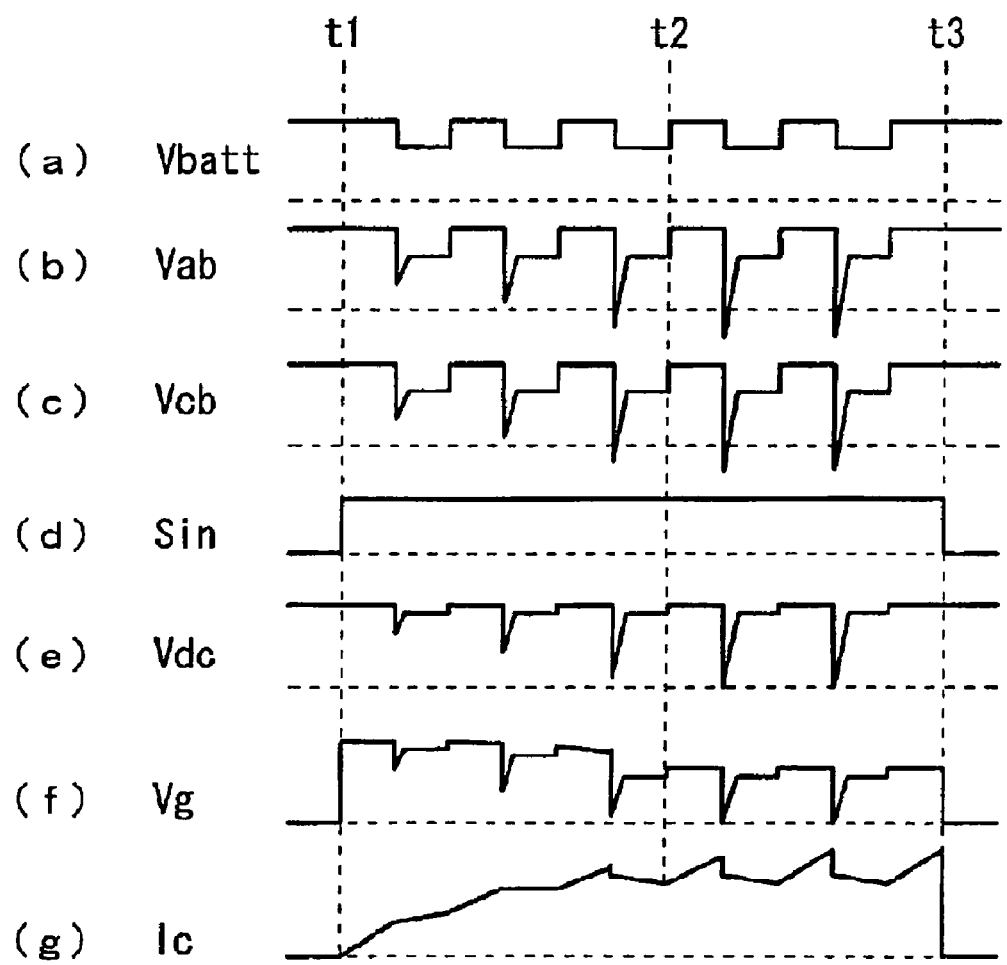
FIG. 9 is a signal waveform diagram accompanying a description of an operation of the known example in a case of omitting the bypass capacitor.

In this way, when a momentary voltage drop occurs in the internal power source voltage Vdc, it is possible to reliably suppress both a flowing out of the gate capacity of the IGBT 3 to the internal power source circuit 20 side, and a flowing out to the ground line 22, in the voltage drop suppressing circuit 50. As a result, as it is possible to maintain the gate capacity and suppress the drop of the gate voltage Vg, the internal power source voltage Vdc1 on the downstream side of the parallel circuit 54 can maintain a voltage of a level slightly lower than the voltage immediately before the internal power source voltage Vdc drops, as shown in (c) of FIG. 3. For this reason, it is also possible to hold the gate voltage Vg of the IGBT 3 within a small fluctuation range, without a steep drop occurring, as shown in (i) of FIG. 3. In response to this, it is also possible to stably increase the current Ic flowing through the IGBT 3, as shown in (j) of FIG. 3, without a steep change occurring, as in the case of the previously described known example shown in FIG. 9. For this reason, it is possible to reliably prevent an induced voltage proportional to the current change from being generated at the inductor L acting as the load.

Moreover, even though the internal power source voltage Vdc fluctuates widely, it is possible to hold the internal power source voltage Vdc1 on the downstream side of the parallel circuit 54 to an extremely small fluctuation, and achieve a stabilization of the internal power source. For this reason, it is also possible to perform a role of temporarily supplementing (supplying) the power source voltage of another circuit which has the internal power source voltage Vdc as a power source.

In this way, according to the first embodiment, in the condition in which the bypass capacitor parallel with the control IC 4 is omitted, even in the event that the power source voltage input into the control IC 4 momentarily drops below the minimum operating voltage, it is possible to stabilize the internal power source voltage Vdc1, and hold the gate voltage Vg at the gate of the IGBT 3 to a slight fluctuation. Moreover, it is possible to make the voltage drop suppressing circuit 50 a simple configuration wherein only the P-type MOSFET 51, N-type MOSFET 52, and self-biasing circuit 53 are provided.

Next, a description will be given, based on FIGS. 4 and 5, of a second embodiment of the invention.

In the second embodiment, the self-biasing circuit is omitted, and an undervoltage detection circuit is applied in its place.

Figure 4:
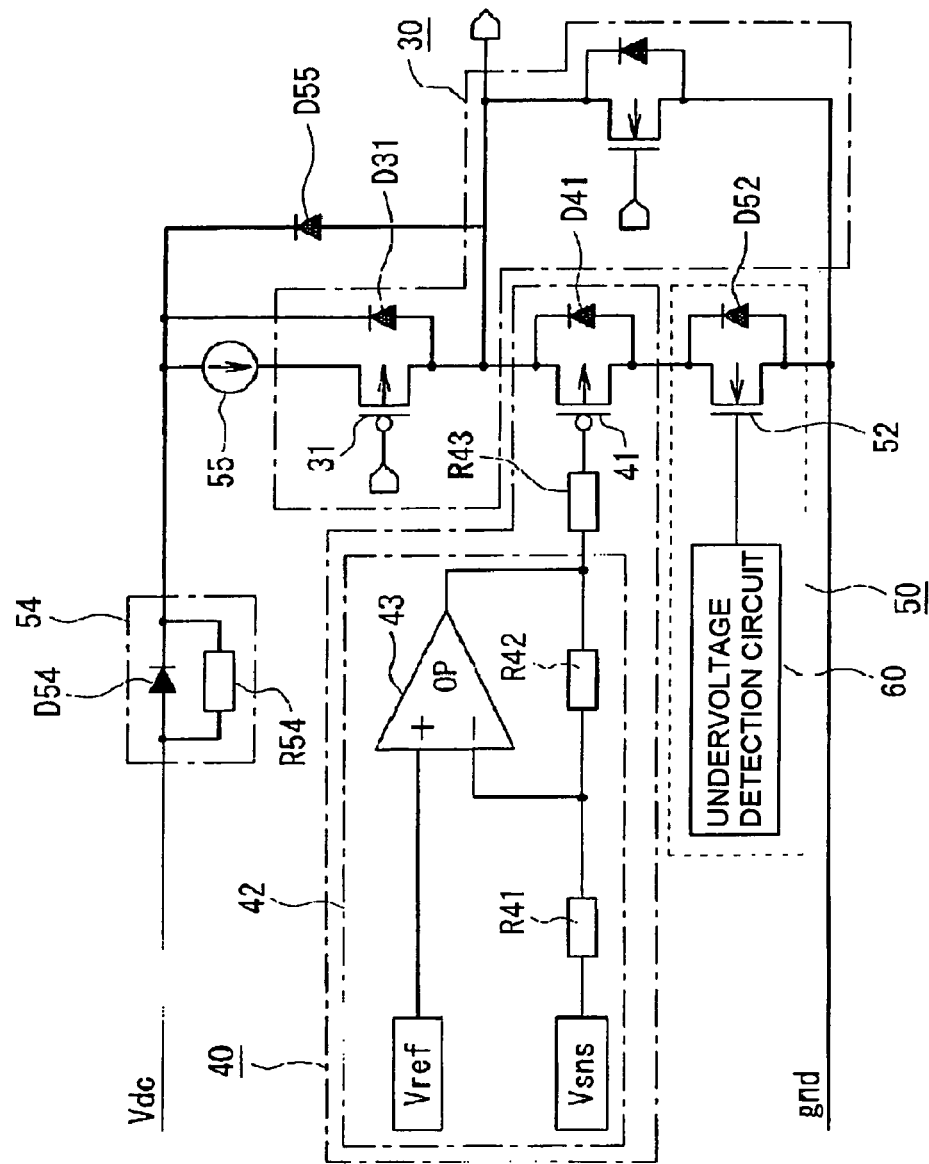
FIG. 4 is a circuit diagram showing a specific configuration of a semiconductor integrated circuit according to a second embodiment of the invention.

That is, the second embodiment has the same configuration as the first embodiment of FIG. 2, except that a normal constant current circuit 55 is applied in place of the second P-type MOSFET 51 of the first embodiment, and that the gate of the N-type MOSFET 52 is driven by an undervoltage detection circuit 60, as shown in FIG. 4. Consequently, the same reference numerals and characters are given to portions corresponding to those in FIG. 2, and a detailed description thereof is omitted.

Figure 5:
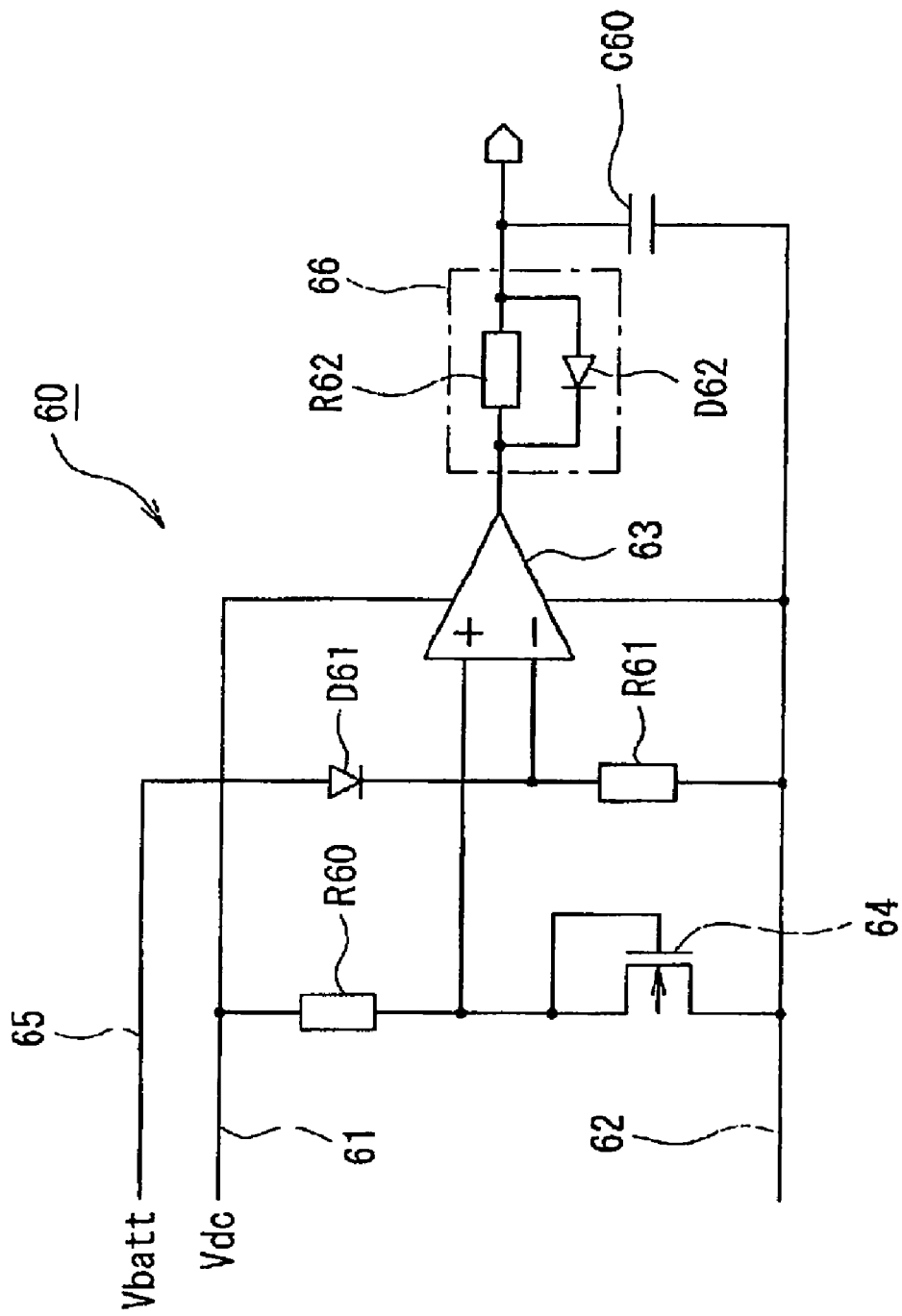
FIG. 5 is a circuit diagram showing a specific configuration of an undervoltage detection circuit in the semiconductor integrated circuit.

Herein, the undervoltage detection circuit 60, being able to respond to a steep voltage fluctuation and having a circuit configuration capable of a low power source voltage operation, is configured as shown in FIG. 5. That is, the undervoltage detection circuit 60 includes a self-biasing type comparator 63 connected between an internal power source line 61 connected to the internal power source circuit 20 (see FIG. 2), and a ground line 62 connected to the ground gnd (see FIG. 2). A connection point of a resistor R60 and an N-type MOSFET 64, which are connected in series between the internal power source line 61 and ground line 62, is connected to the non-inverting input side of the comparator 63. Also, a connection point of a diode D61 and a resistor R61, which are connected in series between a battery line 65, to which the battery voltage Vbatt is applied, and ground line 62, is connected to the inverting input side of the comparator 63.

A parallel circuit 66, configured of, e.g., comprising, a resistor R62 and a diode D62 which has its cathode on the comparator 63 side, is inserted, e.g., connected, between the output side of the comparator 63 and the N-type MOSFET 52, and a gate signal is output from the parallel circuit 66 to the gate of the N-type MOSFET 52. C60 is a capacitor between the gate and emitter of the N-type MOSFET 52.

Next, a description will be given of an operation of the second embodiment.

In the second embodiment, in the event that the internal power source voltage Vdc momentarily drops, dropping lower than the gate voltage Vg of the IGBT 3, the gate capacity of the IGBT 3 is prevented from flowing out through the body diode D31 as a parasitic diode of the P-type MOSFET 31 of the switch circuit 30, suppressing the drop in the gate voltage Vg, in the same way as in the first embodiment.

Meanwhile, with regard to a drop in the gate voltage Vg due to the flowing out of the gate charge to the ground line 22 in a current limiting condition in which the P-type MOSFET 41 of the current limiting circuit 40 is controlled into the turned on condition, in a normal condition in which there is no momentary voltage drop in the internal power source voltage Vdc, the output of the comparator 63 of the undervoltage detection circuit 60 is of the logical value "High". For this reason, the N-type MOSFET 52 changes to the turned on condition, and it is possible to carry out a current limiting process with the current limiting circuit 40.

In the event that, from the normal condition, a momentary voltage drop in the internal power source voltage Vdc occurs, as shown in (b) of FIG. 3, the output voltage of the comparator 63 immediately changes to the logical value "Low". In response to this, the charge accumulated at the gate of the N-type MOSFET 52 immediately flows out to the ground line 62 through the diode D62, and the N-type MOSFET 52 instantaneously shifts to the turned off condition.

As a result, it is possible to prevent the charge accumulated at the gate of the IGBT 3 from flowing out to the ground line 22. Subsequently, the internal power source voltage Vdc recovers to a condition near the normal voltage in a short time, and the output of the comparator 63 inverts to the logical value "High".

However, the resistor R62 being inserted on the output side of the comparator 63, and a low pass filter being configured of, e.g., formed by, the resistor R62 and capacitor C60, the gate potential of the N-type MOSFET 52 rises gently. For this reason, the N-type MOSFET 52 returns to the turned on condition after a sufficient holding time has elapsed from the internal power source voltage Vdc recovering. That is, the fall time of the control voltage applied to the gate of the N-type MOSFET 52 is set to be a time sufficiently shorter than the drop time for which the inter-terminal voltages Vab and Vcb input into the control IC 4 are lower than the minimum operating voltage of the control IC 4, while the rise time, conversely, is set to be a sufficiently long time in comparison with the drop time. As a result, it is possible to reliably carry out a maintaining of the gate voltage Vg of the IGBT 3, and it is possible to reliably stabilize the internal power source voltage Vdc1.

In the way previously described, with the second embodiment as with the first embodiment, a momentary voltage drop in the internal power source voltage Vdc is detected in the undervoltage detection circuit 60, and the N-type MOSFET 52 is instantaneously shifted to the turned off condition. Consequently, in the same way as with the first embodiment, even in the event that there occurs a large voltage drop in the internal power source voltage Vdc which momentarily reaches the minimum operating voltage of the control IC 4, it is possible to suppress the fluctuation of the gate voltage Vg of the IGBT 3, and reliably prevent a steep fluctuation occurring in the current Ic flowing through the IGBT 3. For this reason, it is possible to reliably prevent an induced voltage proportional to the current change from being generated at the inductor L acting as the load.

In the first and second embodiments, a description is given of a case in which, when the internal power source voltage Vdc drops below the gate voltage Vg, a low pass filter is configured of, e.g., formed by, the resistor R54 and gate capacitor of the IGBT 3 by actively utilizing the body diode D31 as a parasitic diode of the P-type MOSFET 31 with the pull-up switch configuration. However, the invention is not limited to the previously described configurations. For example, a separate diode D55 may be connected in parallel with the body diode D31, as shown by a broken line in FIGS. 2 and 4.

Also, in the first and second embodiments, a description is given of a case in which an IGBT is applied as an active element, but the embodiments are not limited in this respect. For example, it is possible to apply the invention to a gate drive device of another active element, such as a power MOSFET, which has a large capacity.

Also, the above has described a case in which the inductor L is applied as a load but, the embodiments are not limited in this respect. Another, e.g, a different, load may also be applied, and it is also possible to apply the invention to a gate drive device of a switching element applied to an inverter configuring, e.g., forming, a power conversion device.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. A gate drive device, comprising:
   a semiconductor integrated circuit, connected to an internal power source circuit supplied by an external power source; and
   a voltage drop suppressing circuit configured to, if an external power source voltage corresponding to the external power source drops below a minimum operating voltage, prevent a drop of an internal power source voltage corresponding to the internal power source circuit below the minimum operating voltage, the voltage drop suppressing circuit including an undervoltage detection circuit configured to detect a fluctuating condition in the internal power source voltage, and a switching element coupled to the detection circuit;
   wherein the undervoltage detection circuit is configured to, in response to detecting the fluctuating condition, control the switching element to inhibit a capacity discharge at a point connected to an output terminal of the semiconductor integrated circuit.

2. The gate drive device of claim 1, wherein the voltage drop suppressing circuit is further configured to prevent a drop of at least a predetermined magnitude in a voltage output to a gate of the gate drive device.

3. The gate drive device according to claim 1, wherein the voltage drop suppressing circuit is further configured to maintain the internal power source voltage at or above the minimum operating voltage for a time longer than a voltage drop time during which the external power source voltage drops below the minimum operating voltage.

4. The gate drive device according to claim 2,
   wherein the undervoltage detection circuit is further configured to detect a voltage drop in at least one of the internal power source voltage or the external power source voltage; and
   wherein the switching element is configured to, if a drop in the at least one of the internal power source voltage or the external power source voltage is detected by the detection circuit, suppress at least one of the drop in the voltage output to the gate or a drop in the internal power source voltage.

5. The gate drive device according to claim 3, wherein the voltage drop suppressing circuit is further configured to prevent a drop of at least a predetermined magnitude in a voltage output to a gate of the gate drive device, and wherein:
   the undervoltage detection circuit is further configured to detect a voltage drop in at least one of the internal power source voltage or the external power source voltage; and
   the switching element is configured to, if a drop in the at least one of the internal power source voltage or the external power source voltage is detected by the detection circuit, suppress at least one of the drop in the voltage output to the gate or a drop in the internal power source voltage.

6. The gate drive device according to claim 4, wherein:
   the switching element includes an N-type MOSFET; and
   a control voltage configured to be applied to a gate of the N-type MOSFET has a fall time sufficiently short, in comparison with a drop time during which at least the external power source voltage drops below the minimum operating voltage, to allow the switching element to assume a condition to suppress the drop in the voltage output to the gate, and
a rise time sufficiently long in comparison with the drop time to allow the switching element to assume the condition to suppress the drop in the voltage output to the gate.

7. The gate drive device according to claim 5, wherein:
the switching element includes an N-type MOSFET; and
a control voltage configured to be applied to a gate of the N-type MOSFET has
a fall time sufficiently short, in comparison with a drop time during which at least the external power source voltage drops below the minimum operating voltage, to allow the switching element to assume a condition to suppress the drop in the voltage output to the gate, and
a rise time sufficiently long in comparison with the drop time to allow the switching element to assume the condition to suppress the drop in the voltage output to the gate.

8. The gate drive device according to claim 4, wherein the undervoltage detection circuit comprises a self-biasing circuit.

9. The gate drive device according to claim 5, wherein the undervoltage detection circuit comprises a self-biasing circuit.

10. The gate drive device according to claim 6, wherein the undervoltage detection circuit comprises a self-biasing circuit.

11. The gate drive device according to claim 7, wherein the undervoltage detection circuit comprises a self-biasing circuit.

12. A gate drive device, comprising:
a semiconductor integrated circuit, connected to an internal power source circuit supplied by an external power source; and
a voltage drop suppressing circuit configured to, if an external power source voltage corresponding to the external power source drops below a minimum operating voltage, prevent a drop of an internal power source voltage corresponding to the internal power source circuit below the minimum operating voltage;
wherein the voltage drop suppressing circuit is further configured to prevent a drop of at least a predetermined magnitude in a voltage output to a gate of the gate drive device, and includes
an undervoltage detection circuit comprising a self-biasing circuit, configured to detect a voltage drop in at least one of the internal power source voltage or the external power source voltage, and
a switching element configured to, if a drop in the at least one of the internal power source voltage or the external power source voltage is detected by the undervoltage detection circuit, suppress at least one of the drop in the voltage output to the gate or a drop in the internal power source voltage; and
wherein the semiconductor integrated circuit includes
a first P-type MOSFET and a third P-type MOSFET connected in series, and
a first N-type MOSFET connected in parallel with the third P-type MOSFET,
wherein the first P-type MOSFET forms a pull-up switch, the third P-type MOSFET forms a source follower, and a connection point of the first P-type MOSFET and first N-type MOSFET is connected to the gate,
a second P-type MOSFET forming a constant current source, connected between the first P-type MOSFET and an internal power source circuit, and
a second N-type MOSFET connected between the third P-type MOSFET and a ground, the second N-type MOSFET configured to in accordance with a control voltage of the undervoltage detection circuit.

13. A gate drive device, comprising:
a semiconductor integrated circuit, connected to an internal power source circuit supplied by an external power source; and
a voltage drop suppressing circuit configured to, if an external power source voltage corresponding to the external power source drops below a minimum operating voltage, prevent a drop of an internal power source voltage corresponding to the internal power source circuit below the minimum operating voltage;
wherein the voltage drop suppressing circuit is further configured to maintain the internal power source voltage at or above the minimum operating voltage for a time longer than a voltage drop time during which the external power source voltage drops below the minimum operating voltage, and to prevent a drop of at least a predetermined magnitude in a voltage output to a gate of the gate drive device, and further includes
an undervoltage detection circuit comprising a self-biasing circuit, and configured to detect a voltage drop in at least one of the internal power source voltage or the external power source voltage, and
a switching element configured to, if a drop in the at least one of the internal power source voltage or the external power source voltage is detected by the undervoltage detection circuit, suppress at least one of the drop in the voltage output to the gate or a drop in the internal power source voltage; and
wherein the semiconductor integrated circuit includes
a first P-type MOSFET and a third P-type MOSFET connected in series, and
a first N-type MOSFET connected in parallel with the third P-type MOSFET,
wherein the first P-type MOSFET forms a pull-up switch, the third P-type MOSFET forms a source follower, and a connection point of the first P-type MOSFET and first N-type MOSFET is connected to the gate,
a second P-type MOSFET forming a constant current source, connected between the first P-type MOSFET and an internal power source circuit, and
a second N-type MOSFET connected between the third P-type MOSFET and a ground, the second N-type MOSFET configured to in accordance with a control voltage of the undervoltage detection circuit.

14. The gate drive device according to claim 10, wherein the semiconductor integrated circuit further includes:
a first P-type MOSFET and a third P-type MOSFET connected in series, and
a first N-type MOSFET connected in parallel with the third P-type MOSFET,
wherein
the first P-type MOSFET forms a pull-up switch,
the third P-type MOSFET forms a source follower, and
a connection point of the first P-type MOSFET and first N-type MOSFET is connected to the gate;
a second P-type MOSFET forming a constant current source, connected between the first P-type MOSFET and an internal power source circuit; and
a second N-type MOSFET connected between the third P-type MOSFET and a ground, the second N-type MOS- FET configured to in accordance with a control voltage of the undervoltage detection circuit.

15. The gate drive device according to claim 11, wherein the semiconductor integrated circuit further includes:
a first P-type MOSFET and a third P-type MOSFET connected in series, and
a first N-type MOSFET connected in parallel with the third P-type MOSFET,
wherein
the first P-type MOSFET forms a pull-up switch,
the third P-type MOSFET forms a source follower, and
a connection point of the first P-type MOSFET and first N-type MOSFET is connected to the gate;
a second P-type MOSFET forming a constant current source, connected between the first P-type MOSFET and an internal power source circuit; and
a second N-type MOSFET connected between the third P-type MOSFET and a ground, the second N-type MOSFET configured to in accordance with a control voltage of the undervoltage detection circuit.

* * * * *